US010672906B2

(12) United States Patent
Chen et al.

(10) Patent No.: US 10,672,906 B2
(45) Date of Patent: Jun. 2, 2020

(54) TRANSISTOR DEVICE

(71) Applicant: Au Optronics Corporation, Hsinchu (TW)

(72) Inventors: Ming-Yan Chen, Hsinchu County (TW); Ming-Hsien Lee, Hsinchu (TW); Che-Chia Chang, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 16/503,483

(22) Filed: Jul. 4, 2019

(65) Prior Publication Data

US 2020/0052115 A1 Feb. 13, 2020

Related U.S. Application Data

(60) Provisional application No. 62/717,260, filed on Aug. 10, 2018.

(30) Foreign Application Priority Data

Mar. 6, 2019 (TW) .................................. 108107484

(51) Int. Cl.
*H01L 29/00* (2006.01)
*H01L 29/78* (2006.01)
(Continued)

(52) U.S. Cl.
CPC .... *H01L 29/7836* (2013.01); *H01L 29/42376* (2013.01); *H01L 29/45* (2013.01); *H01L 29/513* (2013.01); *H01L 29/7831* (2013.01)

(58) Field of Classification Search
CPC ........... H01L 29/7836; H01L 29/42376; H01L 29/45; H01L 29/513; H01L 29/7831
See application file for complete search history.

(56) References Cited

U.S. PATENT DOCUMENTS

| 6,812,490 | B2* | 11/2004 | Takehashi ......... H01L 29/42384 |
| | | | 257/49 |
| 7,259,427 | B2 | 8/2007 | Yamazaki et al. |

(Continued)

FOREIGN PATENT DOCUMENTS

| CN | 101410709 | 4/2009 |
| CN | 105097550 | 11/2015 |

(Continued)

*Primary Examiner* — Nikolay K Yushin
(74) *Attorney, Agent, or Firm* — JCIPRNET

(57) ABSTRACT

A transistor device disposed on a substrate and including a semiconductor layer, a first gate, a second gate, and two source drain electrodes is provided. The semiconductor layer is disposed on the substrate and has a channel region, two lightly-doped regions, and two source drain regions. Each of the two lightly-doped regions has a first boundary adjoined to the channel region and a second boundary adjoined to one of the two source drain regions. The first gate is extended over the channel region of the semiconductor layer, wherein an edge of the first gate is aligned with the first boundary. The second gate is stacked on the first gate and is in contact with the first gate, wherein in a thickness direction, the second gate is overlapped with the two lightly-doped regions. The two source drain electrodes are respectively in contact with the two source drain regions.

19 Claims, 3 Drawing Sheets

(51) Int. Cl.
*H01L 29/423* (2006.01)
*H01L 29/45* (2006.01)
*H01L 29/51* (2006.01)

(56) References Cited

U.S. PATENT DOCUMENTS

| | | |
|---|---|---|
| 9,129,871 B2 | 9/2015 | Yamada et al. |
| 9,786,789 B2 | 10/2017 | Zhou et al. |
| 2004/0089878 A1* | 5/2004 | Takehashi ......... H01L 29/42384 257/200 |
| 2010/0230610 A1 | 9/2010 | Van Der Zaag et al. |
| 2012/0313103 A1 | 12/2012 | Yamada et al. |
| 2013/0234219 A1 | 9/2013 | Yamada et al. |
| 2017/0155002 A1 | 6/2017 | Zhou et al. |

FOREIGN PATENT DOCUMENTS

| | | |
|---|---|---|
| CN | 102820337 | 7/2017 |
| JP | 2006313776 | 11/2006 |

* cited by examiner

TRANSISTOR DEVICE

CROSS-REFERENCE TO RELATED APPLICATION

This application claims the priority benefit of U.S. provisional application Ser. No. 62/717,260, filed on Aug. 10, 2018, and Taiwan application serial no. 108107484, filed on Mar. 6, 2019. The entirety of each of the above-mentioned patent applications is hereby incorporated by reference herein and made a part of this specification.

BACKGROUND OF THE INVENTION

Field of the Invention

The invention relates to an electronic element, and more particularly, to a transistor device.

Description of Related Art

The transistor device uses a semiconductor layer to perform the functions of on and off and switching, and is an indispensable device and/or element in various electronic products. Among various transistor devices, a low-temperature polysilicon thin-film transistor using a polysilicon semiconductor formed by a low-temperature process as a transistor channel has been widely used in display panels due to the excellent carrier mobility thereof. Self-aligned top-gate low-temperature polysilicon thin-film transistors are also widely used as low-temperature polysilicon thin-film transistors because they may accurately define the position of the channel region.

In the fabrication process of a self-aligned top-gate low-temperature polysilicon thin-film transistor, a gate located above the polysilicon semiconductor may be used as a mask of the doping process to form lightly-doped regions on both sides of the region where the polysilicon semiconductor is shielded by the gate, such that the region in which the polysilicon semiconductor is shielded by the gate forms the channel region. The lightly-doped regions located on both sides of the channel region help to suppress the hot electron effect to improve the performance of the self-aligned top-gate low-temperature polysilicon thin-film transistor.

SUMMARY OF THE INVENTION

The invention provides an optoelectronic device that helps to enhance the performance of a transistor.

A transistor device of the invention is disposed on a substrate and includes a semiconductor layer, a first gate, a second gate, and two source drain electrodes. The semiconductor layer is disposed on the substrate and has a channel region, two lightly-doped regions, and two source drain regions. Each of the two lightly-doped regions has a first boundary adjoined to the channel region and a second boundary adjoined to one of the two source drain regions. The first gate is extended over the channel region of the semiconductor layer, wherein an edge of the first gate is aligned with the first boundary. The second gate is stacked on the first gate and is in contact with the first gate, wherein in a thickness direction, the second gate is overlapped with the two lightly-doped regions. The two source drain electrodes are respectively in contact with the two source drain regions.

In an embodiment of the invention, the transistor device further includes a first gate insulating layer. The first gate insulating layer is disposed on the substrate and located between the semiconductor layer and the first gate.

In an embodiment of the invention, the transistor device further includes a second gate insulating layer. The second gate insulating layer is disposed on the substrate, and the first gate insulating layer is located between the second gate insulating layer and the substrate.

In an embodiment of the invention, the first gate insulating layer and the second gate insulating layer are both located between the second gate and the semiconductor layer.

In an embodiment of the invention, the first gate insulating layer has a first source drain opening, and the second gate insulating layer has a second source drain opening. The first source drain opening communicates with the second source drain opening to expose one of the two source drain regions, and one of the two source drain electrodes is extended in the first source drain opening and the second source drain opening to be in contact with one of the two source drain regions.

In an embodiment of the invention, the second gate insulating layer has a gate opening. The gate opening exposes the first gate, and the second gate is extended in the gate opening to be in contact with the first gate.

In an embodiment of the invention, a width of the gate opening is expanded beyond a width of the first gate.

In an embodiment of the invention, the second gate is in contact with a top surface and a sidewall of the first gate in the gate opening.

In an embodiment of the invention, a width of the gate opening is less than a width of the first gate.

In an embodiment of the invention, the sidewall of the second gate insulating layer forming the gate opening is an inclined sidewall.

In an embodiment of the invention, the further away from the first gate insulating layer, the greater a width of the gate opening of the second gate insulating layer.

In an embodiment of the invention, the closer to the two source drain electrodes, the greater a distance between the second gate and the semiconductor layer.

In an embodiment of the invention, the second gate and the two source drain electrodes are formed by a same film layer.

In an embodiment of the invention, each of the two source drain electrodes is separated from the second gate by a distance, and the distance is greater than 2 microns.

In an embodiment of the invention, the second gate shields the first boundary.

In an embodiment of the invention, the two lightly doped regions each include an overlapping portion overlapped with the second gate and a non-overlapping portion not overlapped with the second gate.

In an embodiment of the invention, an extending length of the overlapping portion extended from the first boundary to the non-overlapping portion is greater than 0.3 microns.

In an embodiment of the invention, an extending length of the non-overlapping portion extended from the overlapping portion to the second boundary is greater than 0.3 microns.

In an embodiment of the invention, a doping concentration of the two lightly-doped regions is higher than that of the channel region.

In an embodiment of the invention, a doping concentration of the two source drain regions is higher than that of the two lightly-doped regions.

Based on the above, the transistor device of an embodiment of the invention has dual gates stacked together, wherein the boundary of the channel region and the lightly-doped regions in the semiconductor layer is aligned with the edge of the first gate, and the second gate is partially overlapped with the lightly-doped regions. As such, the transistor device of an embodiment of the invention has a lower off leakage current and has ideal operational performance.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
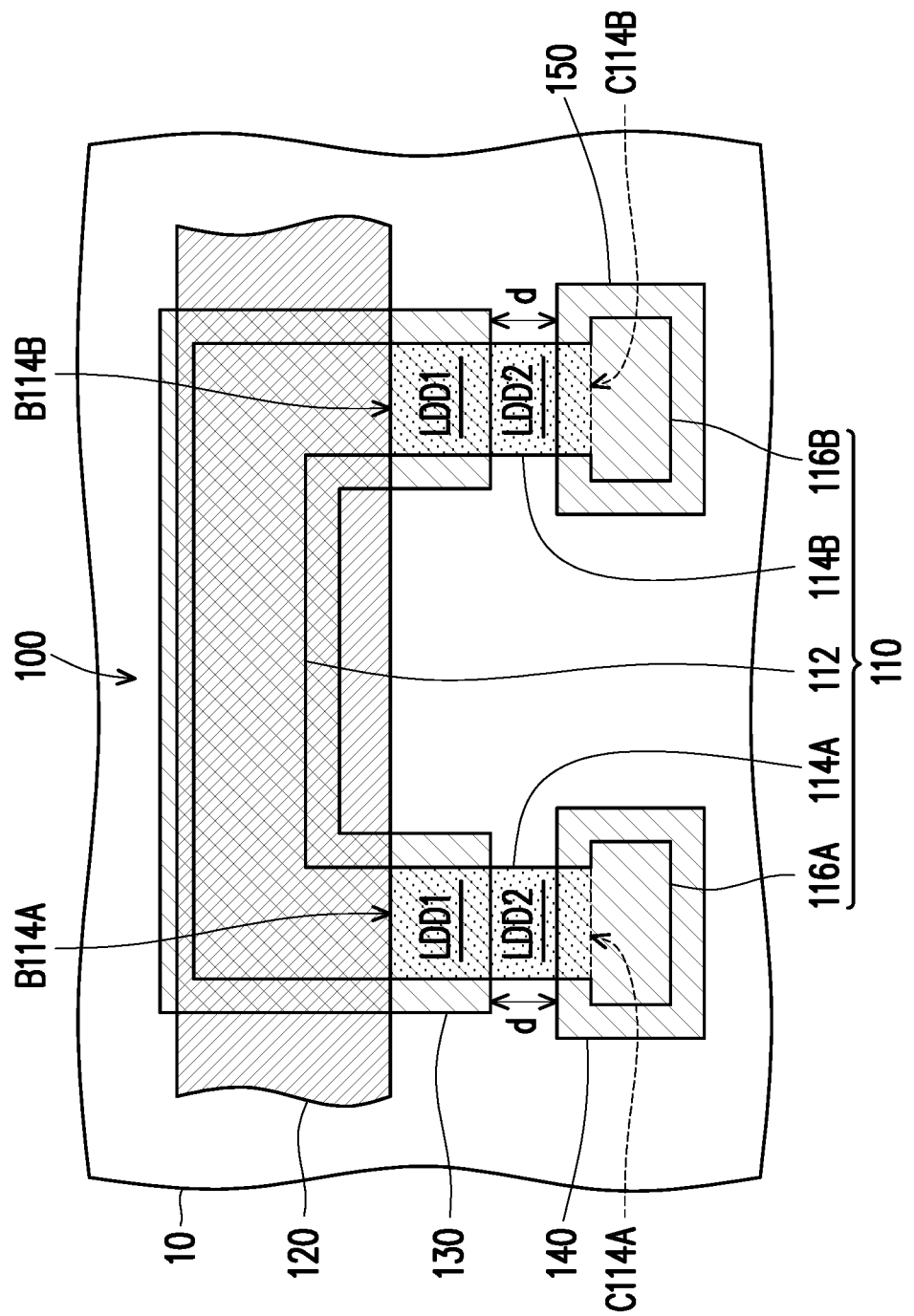
FIG. 1 is a top view of a transistor device of an embodiment of the invention.
Figure 2:
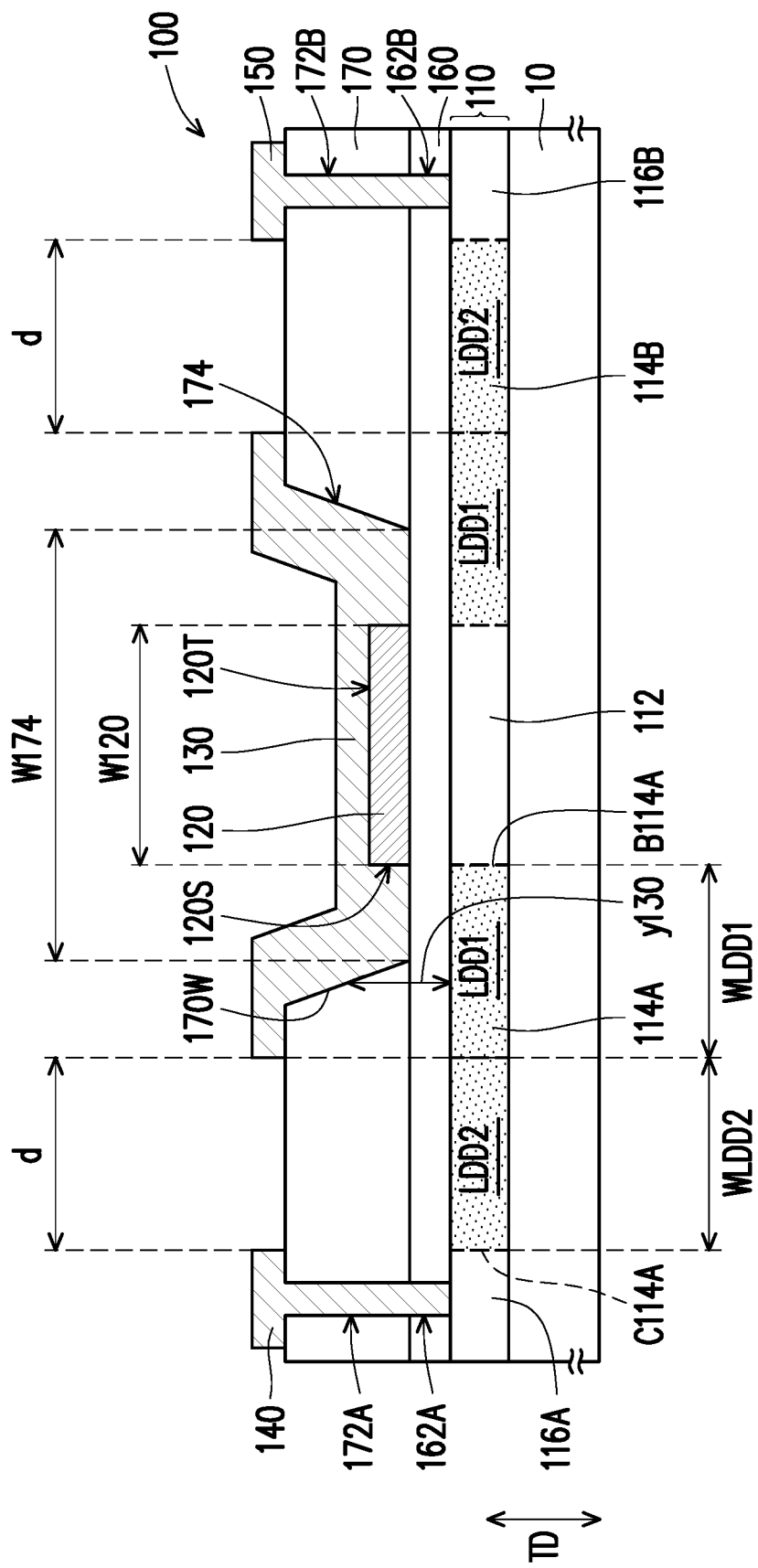
FIG. 2 is a cross section of a transistor device of an embodiment of the invention.

FIG. 1 is a top view of a transistor device of an embodiment of the invention. FIG. 2 is a cross section of a transistor device of an embodiment of the invention. The cross section of FIG. 2 may represent an embodiment of the cross-sectional structure of a transistor device 100. Therefore, the same or similar members in FIG. 1 and FIG. 2 are denoted by the same reference numerals. The transistor device 100 of FIG. 1 and FIG. 2 is disposed on a substrate 10 and includes a semiconductor layer 110, a first gate 120, a second gate 130, a source drain electrode 140, and a source drain electrode 150. The outlines of the semiconductor layer 110, the first gate 120, the second gate 130, the source drain electrode 140, and the source drain electrode 150 presented in FIG. 1 may be regarded as outlines of their respective vertical projections when these members are vertically projected on the substrate 10. Therefore, the overlapping relationships and relative positions between members in the top view may be regarded as the relative relationships of the vertical projections of these members.

The semiconductor layer 110 has a U-shaped pattern in the top view of the present embodiment, but is not limited thereto. Specifically, in FIG. 1 and FIG. 2, the semiconductor layer 110 may be divided into a channel region 112, two lightly-doped regions 114A and 114B, and two source drain regions 116A and 116B. The two lightly-doped regions 114A and 114B are each extended between one of the two source drain regions 116A and 116B and the channel region 112. For example, the lightly-doped region 114A is located between the source drain region 116A and the channel region 112, and the lightly-doped region 114B is located between the source drain region 116B and the channel region 112. In the present embodiment, each of the two lightly-doped regions 114A and 114B has first boundaries B114A and B114B adjoined to the channel region 112, and each of the two lightly-doped regions 114A and 114B has second boundaries C114A and C114B adjoined to the two source drain regions 116A and 116B. The first boundaries B114A and B114B and the second boundaries C114A and C114B may be determined by the doping concentration of the semiconductor layer 110, and may have no physical boundary structure.

Specifically, the semiconductor layer 110 may be a poly-silicon semiconductor or an oxide semiconductor. The lightly-doped regions 114A and 114B have a higher doping concentration than the channel region 112, and the source drain regions 116A and 116B also have a higher doping concentration than the channel region 112. Additionally, the doping concentration of the source drain regions 116A and 116B may be even higher than the doping concentration of the lightly-doped regions 114A and 114B. That is to say, the concentration at which the semiconductor layer 110 is doped may be gradually increased outwardly from the middle portion thereof, but is not limited thereto. In addition, the doping substance that the semiconductor layer 110 is doped with may be determined according to the function required by the transistor device 100, wherein the doping substance may include a P-type doping substance, an N-type doping substance, or a combination of different types of doping substances.

The first gate 120 is shown in an elongated pattern in FIG. 1, but is not limited thereto. The first gate 120 is extended over the channel region 112 of the semiconductor layer 110, that is, the channel region 112 is overlapped with the first gate 120 in a thickness direction TD. Specifically, the first boundary B114A of the lightly-doped region 114A and the first boundary B114B of the lightly-doped region 114B are both aligned with the edge of the first gate 120. In the process of fabricating the transistor device 100, after the semiconductor layer 110 and the first gate 120 are sequentially formed on the substrate 10, a light doping process may be performed. At this time, the channel region 112 in the semiconductor layer 110 is shielded by the first gate 120 and is therefore not doped. At the same time, a portion of the semiconductor layer 110 adjacent to the channel region 112 that is not shielded by the first gate 120 is doped, thereby forming the two lightly-doped regions 114A and 114B located adjacent to the channel region 112. In other words, in the present embodiment, the channel region 112 of the transistor device 100 is self-aligned to the first gate 120 and may be regarded as a portion of the semiconductor layer 110 overlapped with the first gate 120 in the thickness direction TD. The thickness direction TD herein may be regarded as the direction of the thickness of the substrate 10, and is also substantially the same as the direction of the thickness of each film layer.

The second gate 130 is overlapped with the first gate 120 and the second gate 130 is overlapped with the semiconductor layer 110 by a larger area in the thickness direction than the first gate 120. For example, the second gate 130 is overlapped with the channel region 112 as well as a portion of the lightly-doped region 114A and a portion of the lightly-doped region 114B in the thickness direction TD. In other words, in the present embodiment, the second gate 130 shields the first boundary B114A of the lightly-doped region 114A and the first boundary B114B of the lightly-doped region 114B. However, the second boundary C114A of the lightly-doped region 114A and the second boundary C114B of the lightly-doped region 114B are located outside the second gate 130 and are not shielded by the second gate 130. That is, the lightly-doped regions 114A and 114B each include an overlapping portion LDD1 overlapped with the second gate 130 and a non-overlapping portion LDD2 not overlapped with the second gate 130. In some embodiments, the extending length WLDD1 of the overlapping portion LDD1 extended from the first boundary B114A (or B114B)

to the non-overlapping portion LDD2 is greater than 0.3 microns. In some embodiments, an extended length WLDD2 of the non-overlapping portion LDD2 extended from the overlapping portion LDD1 to the second boundary C114A (or C114B) is greater than 0.3 microns.

The two source drain electrodes 140 and 150 may respectively be in contact with the two source drain regions 116A and 116B of the semiconductor layer 110, wherein the source drain electrode 140 may be in contact with the source drain region 116A and the source drain electrode 150 may be in contact with the source drain region 116B. In addition, the source drain electrode 140 and the source drain electrode 150 are both not overlapped with the second gate 130. In some embodiments, the source drain electrode 140, the source drain electrode 150, and the second gate 130 are formed by the same film layer. In other words, when the transistor device 100 is fabricated, the source drain electrode 140, the source drain electrode 150, and the second gate 130 may be formed by patterning the same conductive layer. In order to achieve the desired electrical transmission path, the source drain electrode 140 and the source drain electrode 150 are each separated from the second gate 130 by a distance d. The distance d is greater than 2 microns in some embodiments, but in other embodiments, the distance d only needs to be sufficient to keep the second gate 130 from being electrically connected to the source drain electrode 140 and the source drain electrode 150 and may be changed based on process limits.

In the present embodiment, after the first gate 120 is fabricated on the substrate 10, the material of the second gate 130 is formed on the substrate 10, and therefore the first gate 120 and the second gate 130 are electrodes formed by different film layers. In some embodiments, the first gate 120 and the second gate 130 may be made of different materials or may be made of the same material. When the first gate 120 and the second gate 130 are made of the same material, since the two electrodes are formed by different film layers, the physical boundary structure present between the two electrodes is not integrally formed.

In the present embodiment, the lightly-doped region 114A and the lightly-doped region 114B each include the overlapping portion LDD1 overlapped with the second gate 130 and the non-overlapping portion LDD2 not overlapped with the second gate 130. In the off state of the transistor device 100, a turn-off voltage is inputted to the first gate 120 and the second gate 130, and the carrier mobility in the channel region 112 is shielded or suppressed. At this time, the overlapping portion LDD1 is also affected by an electric field formed by the second gate 130 and has a poor carrier mobility. As a result, although the overlapping portion LDD1 of each of the lightly-doped region 114A and the lightly-doped region 114B is lightly doped, the overlapping portion LDD1 helps to suppress leakage current in the off state of the transistor device 100, and therefore the performance of the transistor device 100 is improved. In the on state of the transistor device 100, an on-voltage is inputted to the first gate 120 and the second gate 130, and therefore the carrier mobility of the channel region 112 is improved. At this time, the non-overlapping portion LDD2 of each of the lightly-doped region 114A and the lightly-doped region 114B is not easily affected by the electric field formed by the second gate 130. Therefore, the non-overlapping portion LDD2 of the lightly-doped region 114A and the lightly-doped region 114B contributes to suppressing the hot electron effect to provide the function of lightly-doped regions in current designs. Therefore, the transistor device 100 of the present embodiment may have the desired operational performance. In the present embodiment, although the overlapping portion LDD1 and the non-overlapping portion LDD2 have the same or similar doping concentration, different degrees of carrier transfer characteristics are provided since one is overlapped with the second gate 130 and the other is not overlapped with the second gate 130, so as to improve the performance of the transistor device 100.

As shown in FIG. 2, the transistor device 100 disposed on the substrate 10 includes a first gate insulating layer 160 and a second gate insulating layer 170 in addition to the semiconductor layer 110, the first gate 120, the second gate 130, the source drain electrode 140, and the source drain electrode 150. The first gate insulating layer 160 and the second gate insulating layer 170 are used to isolate the conductive members to avoid unnecessary electrical connections between the conductive members.

The first gate insulating layer 160 and the second gate insulating layer 170 are both disposed on the substrate 10, and the first gate insulating layer 160 is located between the second gate insulating layer 170 and the substrate 10. In the present embodiment, the first gate insulating layer 160 is stacked on the semiconductor layer 110, and the first gate 120 is stacked on the first gate insulating layer 160. Therefore, the first gate insulating layer 160 is located between the semiconductor layer 110 and the first gate 120 to avoid direct electrical connection between the two members. In addition, the second gate insulating layer 170 is stacked on the first gate insulating layer 160, and the source drain electrode 140, the source drain electrode 150, and the second gate 130 are all stacked on the second gate insulating layer 170. Therefore, both the first gate insulating layer 160 and the second gate insulating layer 170 are located between the second gate 130 and the semiconductor layer 110 and are also located between the source drain electrodes 140 and 150 and the semiconductor layer 110.

In order to bring the source drain electrode 140 and the source drain electrode 150 in contact with the semiconductor layer 110, the first gate insulating layer 160 has first source drain openings 162A and 162B, and the second gate insulating layer 170 has second source drain openings 172A and 172B. The first source drain opening 162A and the second source drain opening 172A communicate with each other to penetrate the first gate insulating layer 160 and the second gate insulating layer 170 to expose the source drain region 116A such that the source drain electrode 140 extended in the first source drain opening 162A and the second source drain opening 172A is in contact with the source drain region 116A. The first source drain opening 162B and the second source drain opening 172B communicate with each other to penetrate the first gate insulating layer 160 and the second gate insulating layer 170 to expose the source drain region 116B such that the source drain electrode 150 extended in the first source drain opening 162B and the second source drain opening 172B is in contact with the source drain region 116B.

Further, in the present embodiment, the second gate insulating layer 170 further has a gate opening 174. The gate opening 174 exposes the first gate 120, and the second gate 130 is extended in the gate opening 174 to be in contact with the first gate 120. That is, the gate opening 174 is an opening penetrating the second gate insulating layer 170 corresponding to the region where the first gate 120 is located. In the cross section of FIG. 2, a width W174 of the gate opening 174 is extended beyond a width W120 of the first gate 120. Therefore, the gate opening 174 exposes a top surface 120T and a sidewall 120S of the first gate 120, and the second gate 130 may cover the top surface 120T and the sidewall 120S of the first gate 120 in the gate opening 174 to increase the contact area of the first the gate 120 and the second gate 130.

In the present embodiment, a sidewall 170W of the second gate insulating layer 170 forming the gate opening 174 is an inclined sidewall such that the width W174 of the gate opening 174 is a non-equal width design. For example, the further away from the first gate insulating layer 160, the greater the width W174 of the gate opening 174. As such, in the thickness direction TD, a distance y130 between the second gate 130 and the semiconductor layer 110 may also exhibit a non-equidistant arrangement. For example, the closer to the source drain electrode 140 or 150, the greater the distance y130 between the second gate 130 and the semiconductor layer 110. In addition, the first source drain opening 162A and the second source drain opening 172A may also have a non-equal width design.

Since the distance y130 between the second gate 130 and the semiconductor layer 110 is not equidistant, the electric field of the second gate 130 acting on the semiconductor layer 110 is also varied. In particular, the portion of the second gate 130 extended beyond the first gate 120 may provide a gradient-changing electric field to the lightly-doped regions 114A and 114B of the semiconductor layer 110 such that the closer to the channel region 112, the greater the electric field that the lightly-doped regions 114A and 114B are subjected to. As a result, in the off state of the transistor device 100, the leakage current situation may be more effectively controlled to achieve the desired performance.

Figure 3:
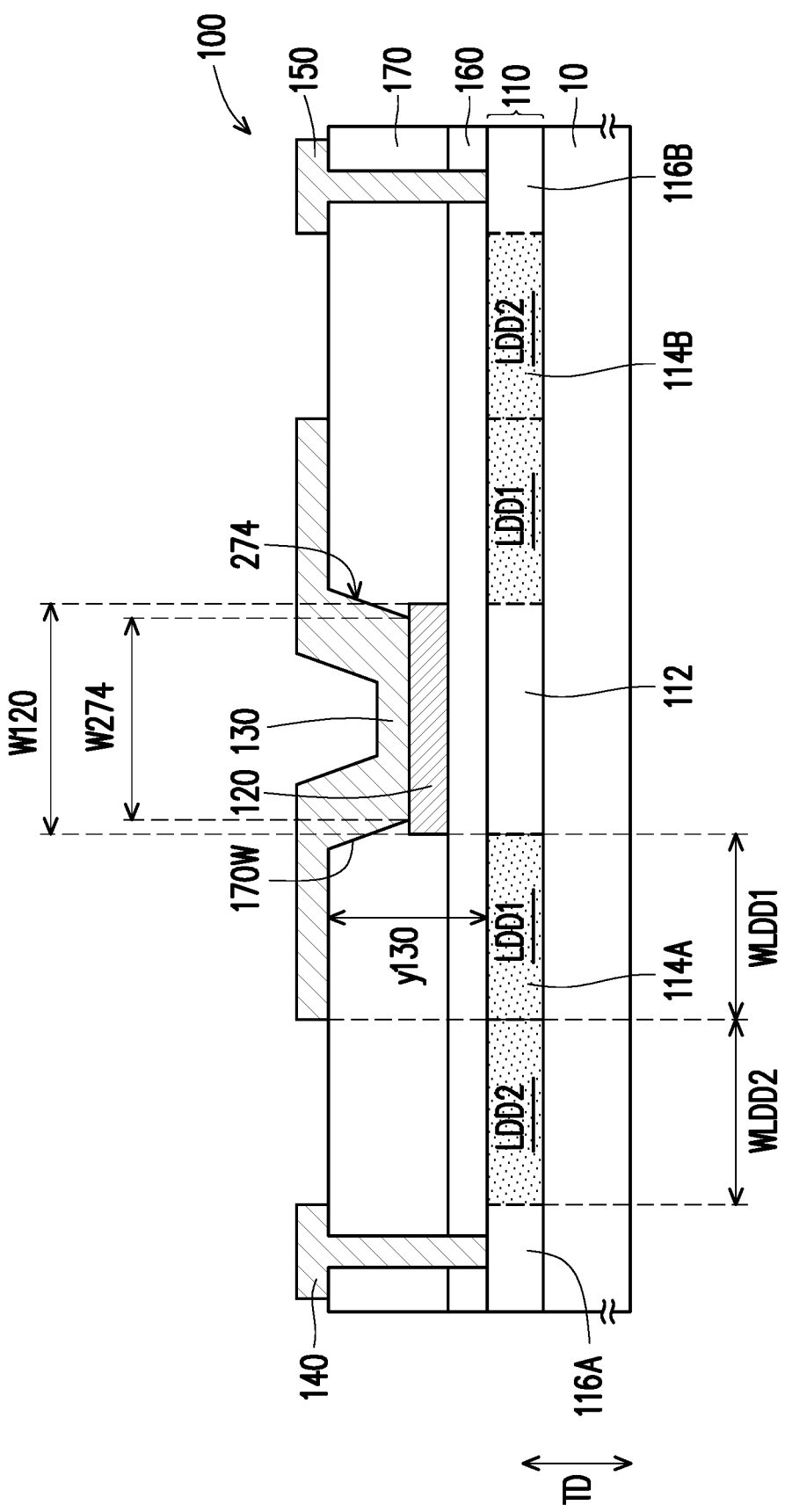
FIG. 3 is a cross section of a transistor device of another embodiment of the invention.

FIG. 3 is a cross section of a transistor device of another embodiment of the invention. The cross section of FIG. 3 may represent another possible embodiment of the cross-sectional structure of the transistor device 100. Therefore, the same or similar members in FIG. 1 and FIG. 3 are denoted by the same reference numerals. As shown in FIG. 3, the transistor device 100 disposed on the substrate 10 includes a first gate insulating layer 160 and a second gate insulating layer 170 in addition to the semiconductor layer 110, the first gate 120, the second gate 130, the source drain electrode 140, and the source drain electrode 150. The first gate insulating layer 160 and the second gate insulating layer 170 are used to isolate the conductive members to avoid unnecessary electrical connections between the conductive members. In particular, the cross section presented in FIG. 3 is similar to the cross section presented in FIG. 2, and the difference between the two embodiments is primarily in the design of a gate opening 274 of the second gate insulating layer 170.

As may be seen from FIG. 3, the gate opening 274 of the second gate insulating layer 170 of the present embodiment has a width W274 that is not constant, and the further away from the first gate 120, the greater the width W274. At the same time, the width W120 of the first gate 120 is greater than the minimum of the width W274. That is, the gate opening 274 of the present embodiment exposes only the top surface 120T of the first gate 120, and the second gate 130 is extended from the second gate insulating layer 170 into the gate opening 274 to be in contact with the top surface 120T of the first gate 120. The sidewall 170W of the second gate insulating layer 170 forming the gate opening 274 is also an inclined sidewall. As a result, the closer to the source drain electrode 140 or 150, the greater the distance y130 between the second gate 130 and the semiconductor layer 110.

Similar to the foregoing embodiments, the lightly-doped regions 114A and 114B in the semiconductor layer 110 each include the overlapping portion LDD1 overlapped with the second gate 130 in the thickness direction TD and the non-overlapping portion LDD2 not overlapped with the second gate 130 in the thickness direction TD. Although the overlapping portion LDD1 and the non-overlapping portion LDD2 have the same or similar doping concentrations, since one is overlapped with the second gate 130 and the other is not overlapped with the second gate 130, different carrier mobility capabilities are provided during the operation of the transistor device 100. As a result, leakage current phenomenon in the off state may be suppressed while suppressing the hot electron effect in the on state.

The transistor device 100 of the foregoing embodiments may be applied to a display panel as a switching element or an active element. For example, the display panel may include an active device array formed by a plurality of scan lines, a plurality of data lines, and a plurality of transistor structures. In practical applications, the first gate 120 may be connected to the scan lines, and one of the source drain electrodes 140 and 150 may be connected to the data lines. In addition, the other of the source drain electrodes 140 and 150 is used to connect to a pixel electrode that is expected to drive a display medium. Therefore, in practical applications, the first gate 120 may be formed by a portion of a corresponding scan line or a structure protruded from a corresponding scan line, and one of the source drain electrodes 140 and 150 may be formed by a portion of a corresponding data line or a structure extended from a corresponding data line. Additionally, a single transistor structure 100 may optionally have a plurality of channel regions 112 without being limited to having a single channel region 112.

Based on the above, the transistor device of an embodiment of the invention has double gates in direct contact with each other, and the expanded areas of the two gates are different. Therefore, the transistor device of an embodiment of the invention may define the channel region by using the profile of one of the gates to form a self-aligned channel region. At the same time, the other gate covers a portion of the lightly-doped regions of the semiconductor layer to help suppress leakage current that may be generated in the off state. In addition, in the transistor device of an embodiment of the invention, at least a portion of the lightly-doped regions is not overlapped with the gate, thereby contributing to suppressing the hot electron effect.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A transistor device disposed on a substrate, the transistor device comprising:
   a semiconductor layer disposed on the substrate and having a channel region, two lightly-doped regions, and two source drain regions, wherein each of the two lightly-doped regions has a first boundary adjoined to the channel region and a second boundary adjoined to one of the two source drain regions;
   a first gate extended over the channel region of the semiconductor layer, wherein an edge of the first gate is aligned with the first boundary;
   a second gate stacked on the first gate and in contact with the first gate, wherein in a thickness direction, the second gate is overlapped with the two lightly-doped regions; and two source drain electrodes respectively in contact with the two source drain regions of the semiconductor layer, wherein the closer to the two source drain electrodes, the greater a distance between the second gate and the semiconductor layer.

2. The transistor device of claim 1, wherein the second gate and the two source drain electrodes are formed by a same film layer.

3. The transistor device of claim 1, wherein each of the two source drain electrodes is separated from the second gate by a distance, and the distance is greater than 2 microns.

4. The transistor device of claim 1, wherein the second gate shields the first boundary.

5. The transistor device of claim 1, wherein a doping concentration of the two lightly-doped regions is higher than that of the channel region.

6. The transistor device of claim 1, wherein a doping concentration of the two source drain regions is higher than that of the two lightly-doped regions.

7. The transistor device of claim 1, wherein each of the two lightly-doped regions comprise an overlapping portion overlapped with the second gate and a non-overlapping portion not overlapped with the second gate.

8. The transistor device of claim 7, wherein an extending length of the overlapping portion extended from the first boundary to the non-overlapping portion is greater than 0.3 microns.

9. The transistor device of claim 7, wherein an extending length of the non-overlapping portion extended from the overlapping portion to the second boundary is greater than 0.3 microns.

10. The transistor device of claim 1, further comprising a first gate insulating layer, wherein the first gate insulating layer is disposed on the substrate and located between the semiconductor layer and the first gate.

11. The transistor device of claim 10, further comprising a second gate insulating layer, wherein the second gate insulating layer is disposed on the substrate, and the first gate insulating layer is located between the second gate insulating layer and the substrate.

12. The transistor device of claim 11, wherein the first gate insulating layer and the second gate insulating layer are both located between the second gate and the semiconductor layer.

13. The transistor device of claim 11, wherein the first gate insulating layer has a first source drain opening, the second gate insulating layer has a second source drain opening, the first source drain opening communicates with the second source drain opening to expose one of the two source drain regions, and one of the two source drain electrodes extends in the first source drain opening and the second source drain opening to be in contact with the one of the two source drain regions.

14. The transistor device of claim 11, wherein the second gate insulating layer has a gate opening, the gate opening exposes the first gate, and the second gate extends in the gate opening to be in contact with the first gate.

15. The transistor device of claim 14, wherein a width of the gate opening is less than a width of the first gate.

16. The transistor device of claim 14, wherein the sidewall of the second gate insulating layer forming the gate opening is an inclined sidewall.

17. The transistor device of claim 14, wherein the further away from the first gate insulating layer, the greater a width of the gate opening of the second gate insulating layer.

18. The transistor device of claim 14, wherein a width of the gate opening is expanded beyond a width of the first gate.

19. The transistor device of claim 18, wherein the second gate is in contact with a top surface and a sidewall of the first gate in the gate opening.

* * * * *